(12) United States Patent
Otsubo (10) Patent No.: US 7,099,363 B2
(45) Date of Patent: Aug. 29, 2006

(54) SURFACE-EMITTING LASER WITH A LOW THRESHOLD VALUE AND LOW POWER CONSUMPTION AND METHOD OF MANUFACTURING THE SAME

(75) Inventor: Koji Otsubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 114 days.

(21) Appl. No.: 10/309,270

(22) Filed: Dec. 4, 2002

(65) Prior Publication Data

US 2003/0174750 A1 Sep. 18, 2003

(30) Foreign Application Priority Data

Mar. 13, 2002 (JP) ............................. 2002-069066

(51) Int. Cl.
*H01S 5/00* (2006.01)
(52) U.S. Cl. .............................. 372/46.01; 372/46.013
(58) Field of Classification Search ............ 372/45–46, 372/45.01, 46.01, 46.013
See application file for complete search history.

(56) References Cited

U.S. PATENT DOCUMENTS

| 5,493,577 | A | * | 2/1996 | Choquette et al. ............ 372/46 |
| 5,886,370 | A | * | 3/1999 | Sun et al. ..................... 257/94 |
| 6,489,636 | B1 | * | 12/2002 | Goetz et al. ................. 257/94 |
| 6,614,821 | B1 | | 9/2003 | Jikutani et al. ............... 372/43 |
| 6,618,413 | B1 | * | 9/2003 | Bour et al. .................... 372/45 |
| 2001/0006528 | A1 | * | 7/2001 | Sato et al. ..................... 372/46 |
| 2003/0012242 | A1 | * | 1/2003 | Iwai et al. ..................... 372/46 |
| 2003/0085409 | A1 | * | 5/2003 | Shen et al. .................... 257/79 |
| 2003/0198268 | A1 | | 10/2003 | Jikutani et al. ............... 372/46 |
| 2004/0228381 | A1 | | 11/2004 | Jikutani et al. ............... 372/46 |

FOREIGN PATENT DOCUMENTS

| JP | 11-233888 | 8/1999 |
| JP | 2000-22282 | 1/2000 |
| JP | 2001-223433 | 8/2001 |
| JP | 2001-251016 | 9/2001 |

OTHER PUBLICATIONS

Hersee et al. "Low-threshold GRIN-SCH GaAs/GaAlAs laser structure grown by OM VPE," Electronics Letters, vol. 18, No. 14, Jul. 1982, p. 618-620.*

* cited by examiner

*Primary Examiner*—James Menefee
(74) *Attorney, Agent, or Firm*—Armstrong, Kratz, Quintos, Hanson & Brooks, LLP (57) ABSTRACT

A surface-emitting laser has a lower multilayer film reflecting mirror, an active layer, a current confinement layer, a clad layer, an upper multilayer film reflecting mirror, and an upper electrode formed in the order described on the upper surface of a substrate having a lower electrode formed on the lower surface thereof. The current confinement layer includes a conductive part and an insulating part surrounding the conductive part with the conductive part being defined by a sidewall surface that widens along a direction toward the active layer.

8 Claims, 13 Drawing Sheets

SURFACE-EMITTING LASER WITH A LOW THRESHOLD VALUE AND LOW POWER CONSUMPTION AND METHOD OF MANUFACTURING THE SAME

CROSS-REFERENCE TO RELATED APPLICATION

The present application is based on Japanese priority application No. 2002-069066 filed on Mar. 13, 2002, the entire contents of which are hereby incorporated by reference.

BACKGROUND OF THE INVENTION

1. Field of the Invention

The present invention relates to a surface-emitting laser emitting light in a direction vertical to a layer surface, and a method of producing the same. In recent years, more and more studies have been conducted on optical communication and optical data links suitable for high-speed transmission. A surface-emitting laser is a key device for optical transmission, and its commercialization has been actively pursued, particularly for its potential for a lower threshold value, reduced power consumption, and lower production cost.

2. Description of the Related Art

Figure 1:
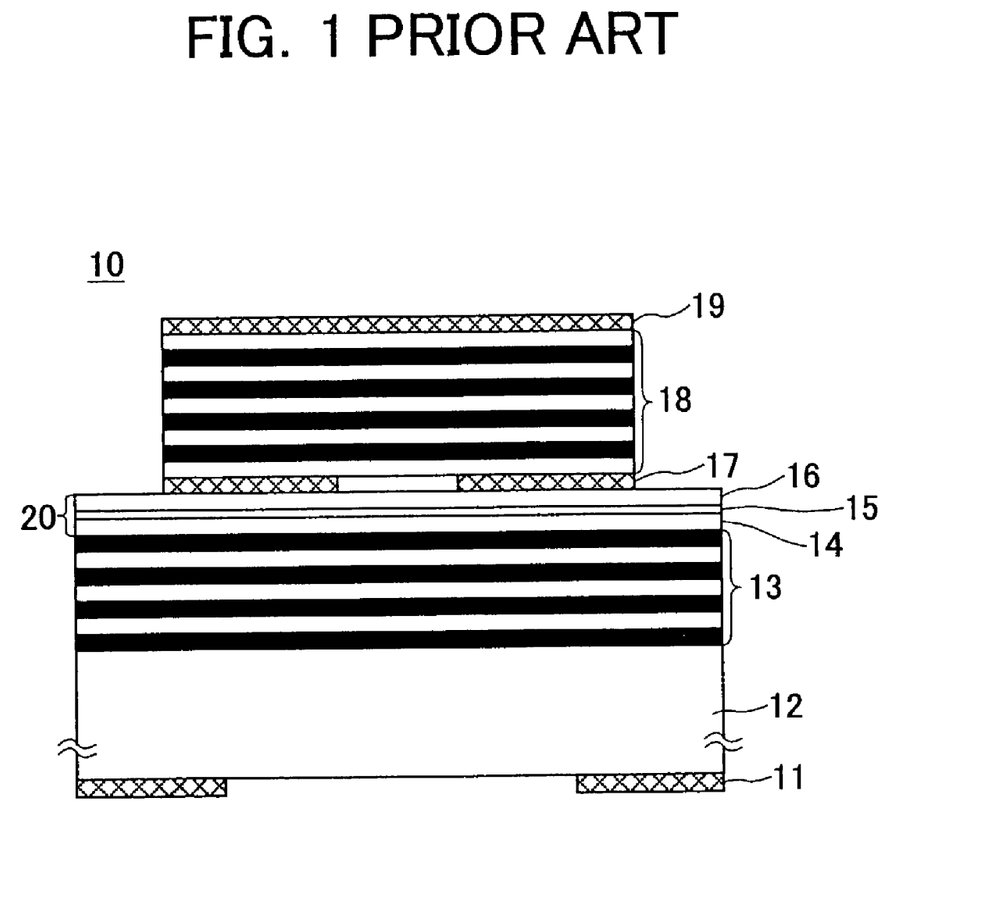
FIG. 1 is a sectional view of a conventional vertical-cavity surface-emitting laser of first prior art.

FIG. 1 is a sectional view of a conventional vertical-cavity surface-emitting laser 10 (first prior art). According to FIG. 1, the surface-emitting laser 10 has a layer structure of a lower negative electrode 11, an n-type substrate 12, an n-type lower semiconductor multilayer film reflecting mirror 13, a resonator 20 including lower and upper clad layers 14 and 16 and an active layer 15 sandwiched there between, a current confinement layer 17, a p-type upper semiconductor multilayer film reflecting mirror 18, and an upper positive electrode 19 that are layered in the order described.

This structure has the advantage of being formable by a single crystal growth. However, in this structure, the electrical resistance of the entire surface-emitting laser 10 is increased because of the large electrical resistance of the semiconductor multilayer film reflecting mirrors 13 and 18 through which electric current is applied. Each of the semiconductor multilayer film reflecting mirrors 13 and 18 is a multilayer film formed by layering semiconductor films of two types of different refractive indices. Because there is a large band gap between the two types of semiconductor films, a large number of spikes are formed on each heterointerface of the band structure. The spikes become barriers to carriers, particularly, holes, so as to increase electrical resistance. When electrical resistance is increased, power consumption increases, thus making it difficult to lower power consumption.

Figure 2:
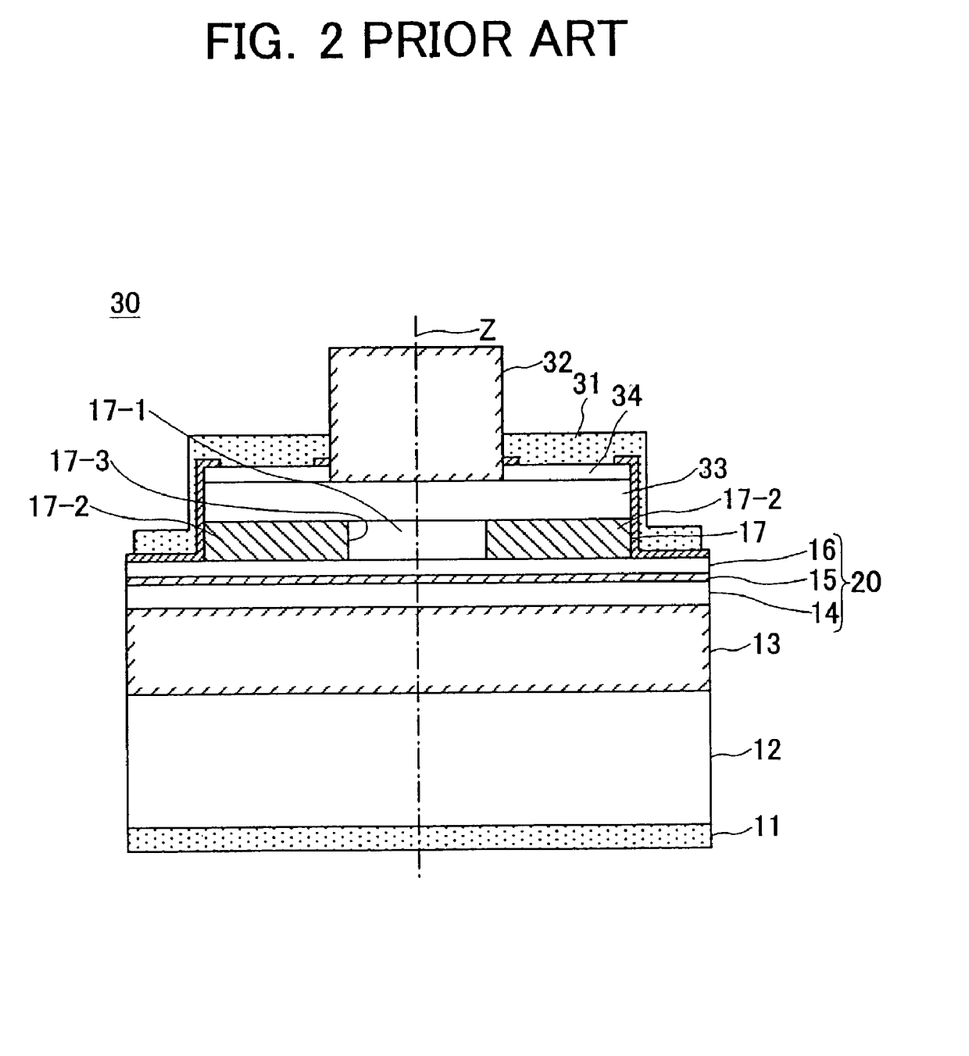
FIG. 2 is a sectional view of a conventional surface-emitting laser of second prior art to which electric current is applied from its sides.

FIG. 2 is a sectional view of a conventional surface-emitting laser 30 to which electric current is applied from its sides (second prior art). According to FIG. 2, an upper electrode 31 of the surface-emitting layer 30 is provided around an upper multilayer film reflecting mirror 32 so that the electric current is applied to the active layer 15 without flowing through the upper multilayer film reflecting mirror 32. Therefore, the electrical resistance of the entire surface-emitting laser 30 can avoid the influence of the electrical resistance of the upper multilayer film reflecting mirror 32. Accordingly, the surface-emitting laser 30 can be reduced in resistance compared with the surface-emitting laser 10 of the first prior art.

In the surface-emitting laser 30, the current confinement layer 17 is formed between the upper electrode 31 and the active layer 15 in order to reduce the region of the active layer 15 to which region the electric current is applied. The current confinement layer 17 is composed of a conductive part 17-1 formed around the central axis Z of the surface-emitting laser 30 and an insulating part 17-2 formed around the conductive part 17-1. The electric current applied from the upper positive electrode 31 is restricted by the insulating part 17-2 of the current confinement layer 17 so as to flow through the conductive part 17-1. Accordingly, the electric current can be concentrated on a small region of the active layer 15, thereby increasing the efficiency of laser oscillation and at the same time decreasing a threshold current.

Figure 3:
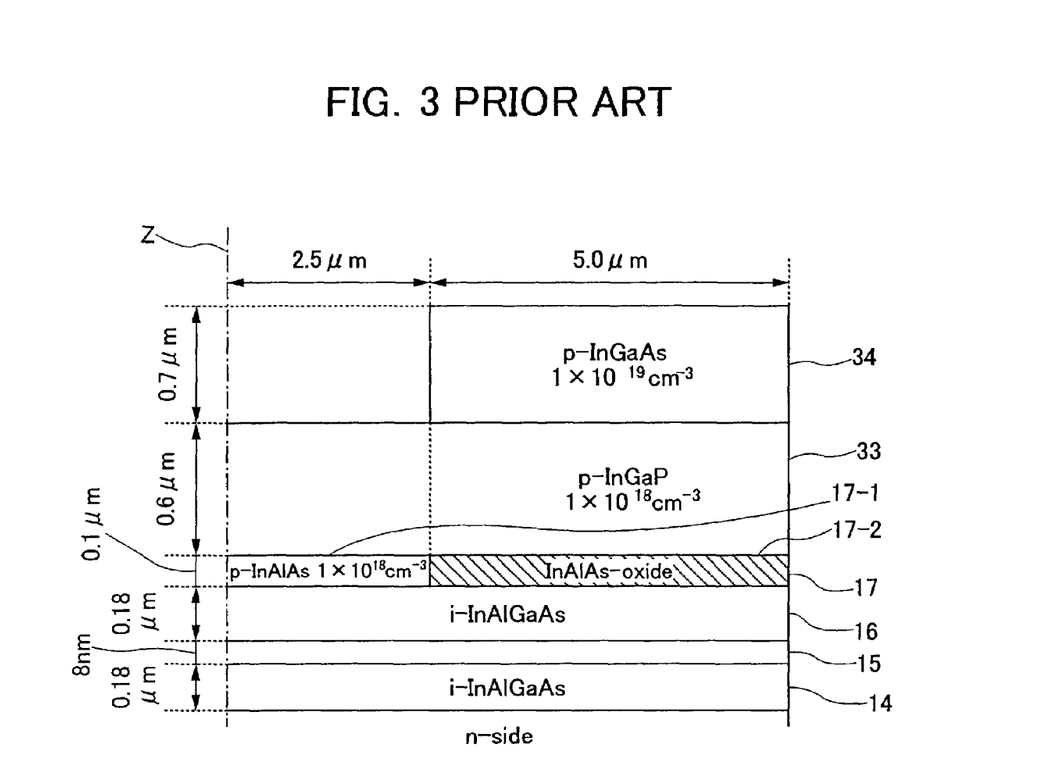
FIG. 3 is a diagram showing the parameters of each layer of the surface-emitting laser of the second prior art.
Figure 4:
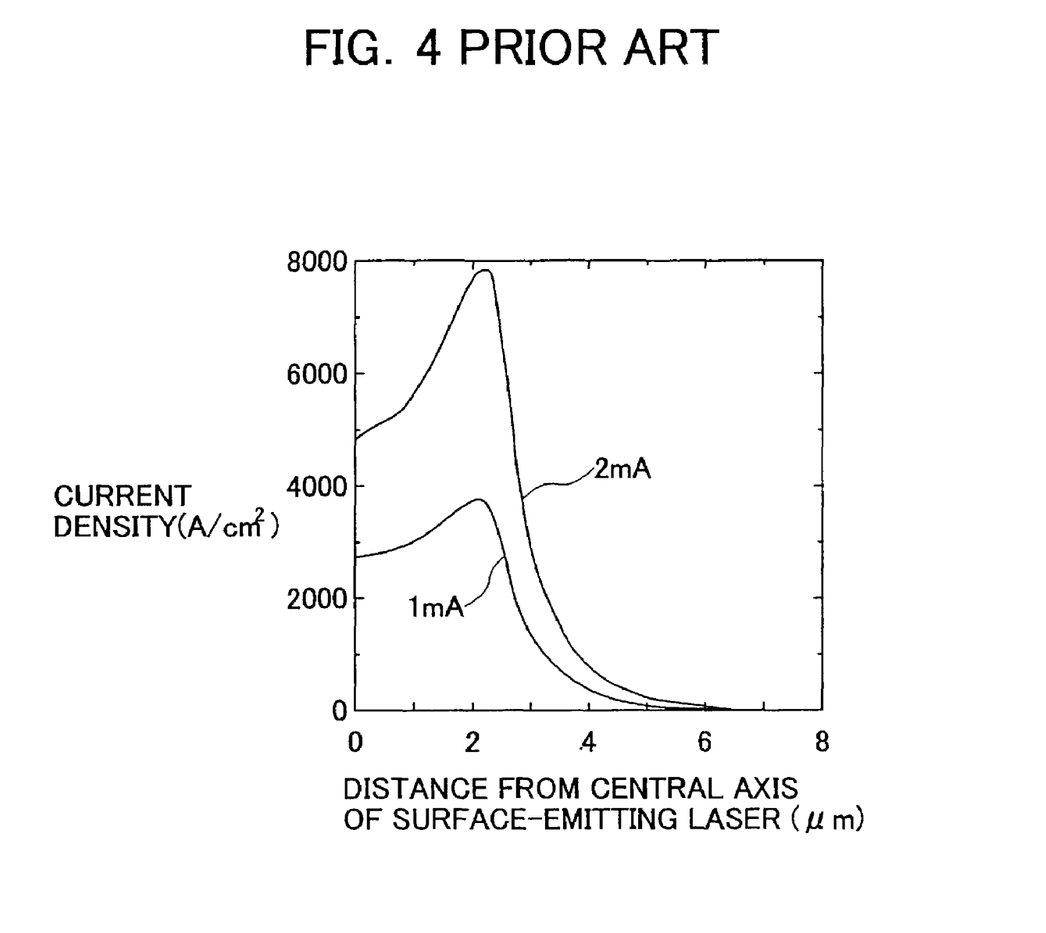
FIG. 4 is a graph showing current density distributions in the surface-emitting laser of the second prior art.

A computer simulation was conducted on the current density distributions of electric currents applied to the active layer 15 of the surface-emitting laser 30. FIG. 3 is a diagram showing the parameters, that is, the composition, film thickness, and doping density of each layer for the computer simulation. FIG. 4 shows the results of the computer simulation.

FIG. 4 is a graph showing the current densities of the electric currents applied to the active layer 15. In FIG. 4, the horizontal axis represents the distance from the central axis Z of the surface-emitting laser 30 and the vertical axis represents the current density. Further, the applied electric currents were 1 mA and 2 mA in the computer simulation.

FIG. 4 shows that the current density increases in the (radial) direction away from the central axis Z of the surface-emitting laser 30 to be maximized particularly at positions substantially below a sidewall surface 17-3, that is, the boundary between the conductive part 17-1 and the insulating part 17-2 of the current confinement layer 17. Further, this phenomenon becomes more apparent in the case of the 2 mA current. This is because the electric current is applied to the active layer 15, being concentrated on the sidewall surface 17-3 and its periphery. In such a case, the surface-emitting laser 30 is likely to oscillate with a high-order mode having a greater threshold gain than a basic mode. Then, the threshold current increases or an excess current flows, thus causing the problem of damaging the surface-emitting laser 30 before its laser oscillation.

Figure 5:
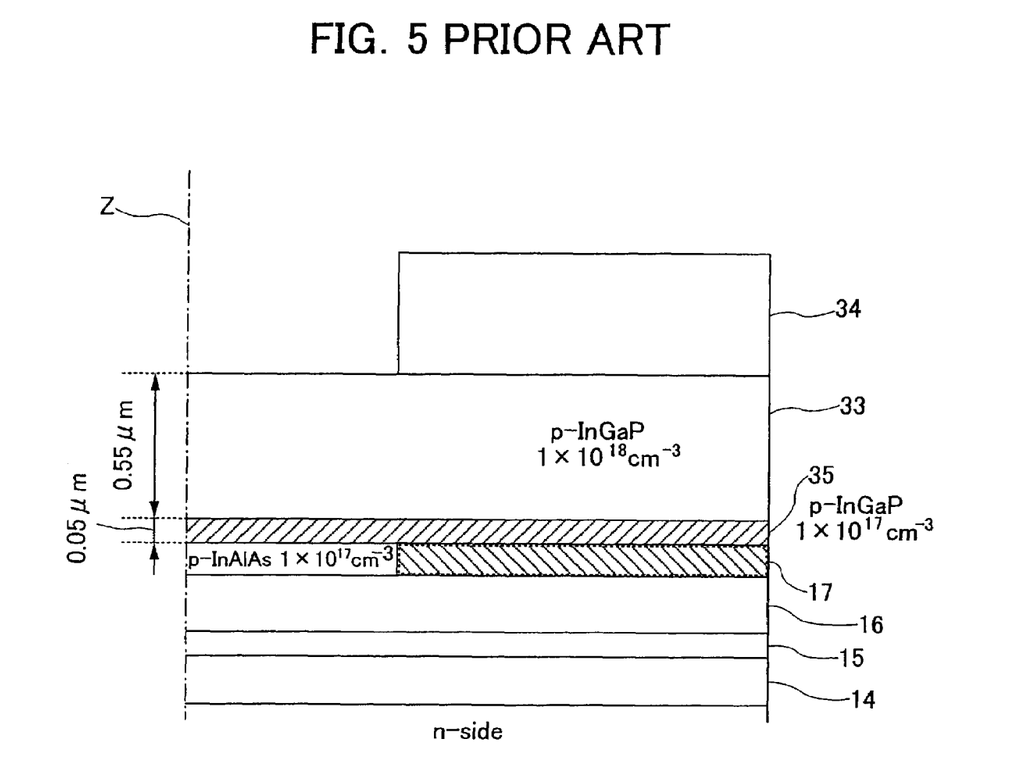
FIG. 5 is a diagram showing the parameters of each layer of a surface-emitting laser of third prior art.

According to a well-known method, the doping density is reduced for the conductive part 17-1 of the current confinement layer 17 and part of a first clad layer 33 formed directly thereon in order to control the concentration of the electric current on the periphery of the conductive part 17-1. FIG. 5 is a diagram showing the parameters of each layer of a surface-emitting laser according to such a method (third prior art). In FIG. 5, the same parameters as those of FIG. 3 are not shown.

Figure 6:
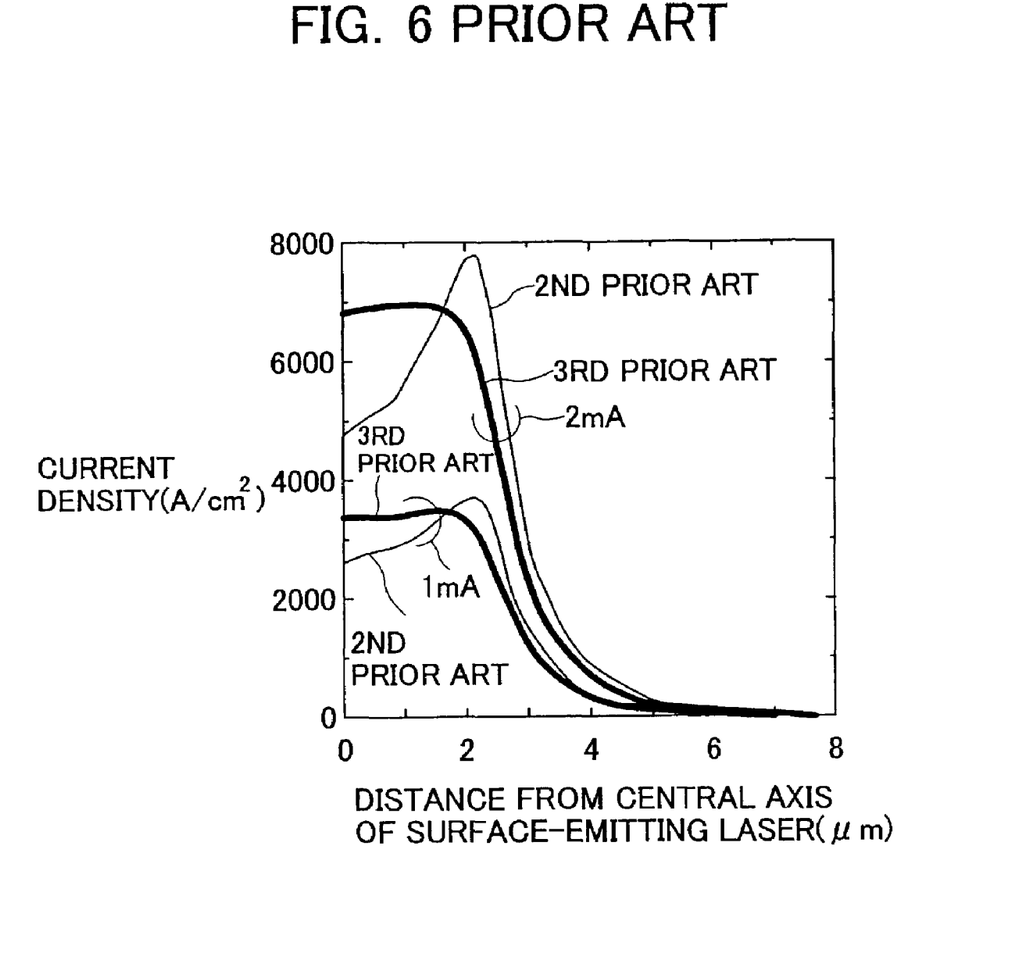
FIG. 6 is a graph showing current density distributions in the surface-emitting laser of third prior art.
Figure 7:
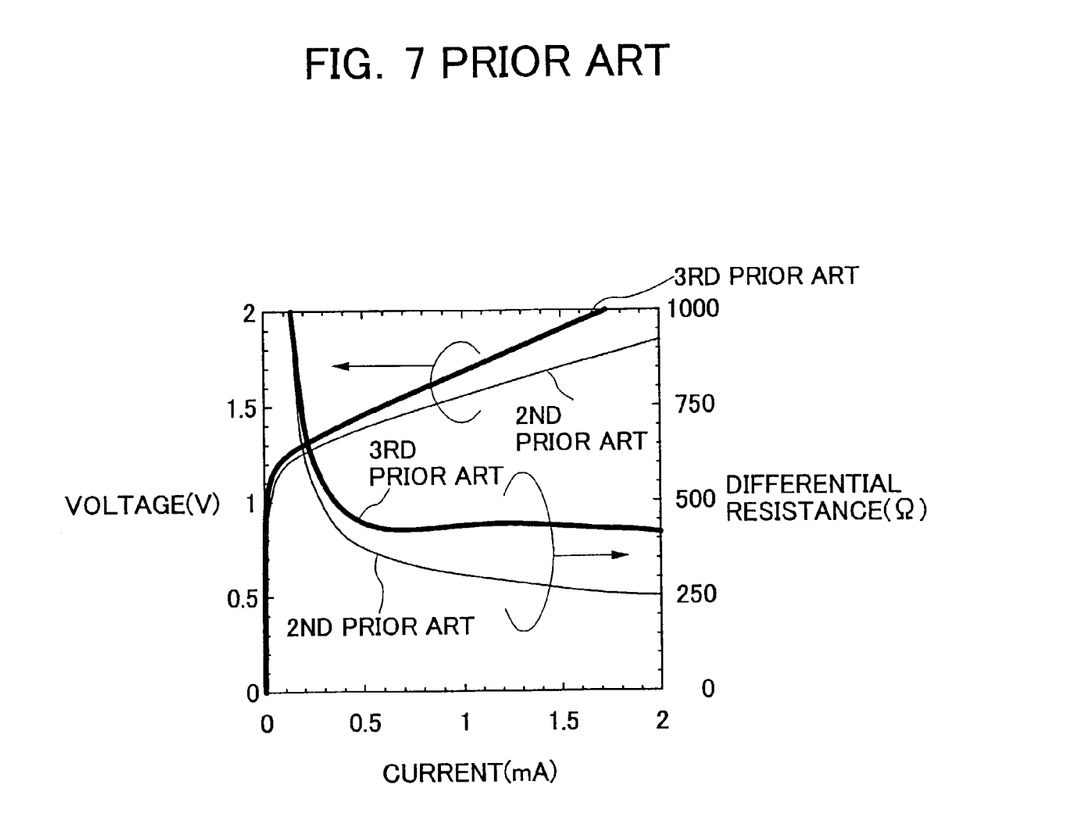
FIG. 7 is a graph showing the voltage-current characteristics and the differential resistance-current characteristics of the surface-emitting laser of the third prior art.

According to FIG. 5, in contrast to the doping density of $1 \times 10^{18}$ $cm^{-3}$ of the first clad layer 33 of p-InGaP, the doping density of the p-InAlAs conductive part 17-1 of the current confinement part 17 is reduced to $1 \times 10^{17}$ $cm^{-3}$, and further, a p-InGaP second clad layer 35 of a doping density of $1 \times 10^{17}$ $cm^{-3}$ and a thickness of 0.05 μm is formed directly on the current confinement layer 17. A computer simulation was conducted using the parameters, that is, the composition, film thickness, and doping density of each layer shown in FIG. 5. FIGS. 6 and 7 show the results of the computer simulation.

FIG. 6 is a graph showing the current density distributions of electric currents applied to the active layer 15. FIG. 6 show the results of the 1 mA and 2 mA applied currents together with the results of the computer simulation of the second prior art for comparison. FIG. 7 is a graph showing the voltage-current characteristics and the differential resistance-current characteristics of the surface-emitting laser of the third prior art. FIG. 7 also shows the results of the computer simulation of the second prior art.

According to FIG. 6, the current density remains substantially constant in the direction away from the central axis of the surface-emitting laser up to positions substantially just below the sidewall surface 17-3 of the current confinement layer 17. Outside those positions, the current density decreases without having a peak maximum value. Accordingly, the problem of the current concentration on a part substantially right below the sidewall surface 17-3 can be eliminated by this method.

However, according to FIG. 7, when the applied current is increased, the voltage increases at a faster rate in the third prior art than in the second prior art, in which the second clad layer 35 whose doping density is decreased by one order of magnitude is not provided. That is, the differential resistance of the surface-emitting laser increases to cause the problem of an increase in its power consumption.

Further, according to another method, the electric resistance of the surface-emitting laser can be decreased by increasing the doping density of the first clad layer 33 formed directly on the second clad layer 35. However, such a method may cause free carrier absorption.

SUMMARY OF THE INVENTION

Accordingly, it is a general object of the present invention to provide a surface-emitting laser in which the above-described disadvantages are eliminated and a method of manufacturing such a surface-emitting laser.

A more specific object of the present invention is to provide a surface-emitting laser in which electric current is applied evenly to its active layer and its differential resistance is reduced so that a lower threshold value and lower power consumption can be realized, and a method of manufacturing such a surface-emitting laser.

The above objects of the present invention are achieved by a surface-emitting laser including a substrate having first and second opposing sides, a first multilayer film reflecting mirror formed on the first side of the substrate, an active layer formed on the first multilayer film reflecting mirror, a current confinement layer formed on the active layer, a clad layer formed on the current confinement layer, a second multilayer film reflecting mirror formed on part of the clad layer, a first electrode formed on the clad layer, and a second electrode formed on the second side of the substrate, wherein the current confinement layer includes a conductive part and an insulating part surrounding the conductive part, the conductive part being defined by a sidewall surface that widens along a direction toward the active layer.

The above objects of the present invention are also achieved by a surface-emitting laser including a substrate having first and second opposing sides, a first multilayer film reflecting mirror formed on the first side of the substrate, an active layer formed on the first multilayer film reflecting mirror, a current confinement layer formed on the active layer, a clad layer formed on the current confinement layer, a second multilayer film reflecting mirror formed on part of the clad layer, a first electrode formed on the clad layer, and a second electrode formed on the second side of the substrate, wherein the current confinement layer includes a conductive part and an insulating part surrounding the conductive part, the conductive part having a shape narrowing toward the clad layer from the active layer.

According to each of the above-described surface-emitting lasers, the conductive part of the current confinement layer has a shape that widens along the direction toward the active layer. Thereby, the concentration of electric current on part of the active layer immediately below the sidewall surface of the conductive part is controlled so that the electric current can be applied more evenly to the active region of the active layer and at the same time the electric resistance of the surface-emitting laser can be reduced. As a result, the surface-emitting laser with a low threshold and low power consumption can be realized.

The above objects of the present invention are also achieved by a method of manufacturing a surface-emitting laser including a substrate having first and second opposing sides, a first multilayer film reflecting mirror formed on the first side of the substrate, an active layer formed on the first multilayer film reflecting mirror, a current confinement layer formed on the active layer, a clad layer formed on the current confinement layer, a second multilayer film reflecting mirror formed on part of the clad layer, a first electrode formed on the clad layer, and a second electrode formed on the second side of the substrate, the method including the step of (a) forming the current confinement layer, wherein the step (a) includes the steps of (b) forming a semiconductor film so that Al density increases continuously in the semiconductor film as the semiconductor film is formed, (c) forming a mesa by etching at least the semiconductor film, and (d) forming the current confinement layer by performing thermal oxidation using steam on the semiconductor film from a sidewall surface of the mesa.

The above objects of the present invention are further achieved by a method of manufacturing a surface-emitting laser including a substrate having first and second opposing sides, a first multilayer film reflecting mirror formed on the first side of the substrate, an active layer formed on the first multilayer film reflecting mirror, a current confinement layer formed on the active layer, a clad layer formed on the current confinement layer, a second multilayer film reflecting mirror formed on part of the clad layer, a first electrode formed on the clad layer, and a second electrode formed on the second side of the substrate, the method including the step of (a) forming the current confinement layer, wherein the step (a) includes the steps of (b) forming a plurality of semiconductor films so that Al density increases film by film in the semiconductor films as the semiconductor films are formed, (c) forming a mesa by etching at least the semiconductor films, and (d) forming the current confinement layer by performing thermal oxidation using steam on the semiconductor films from a sidewall surface of the mesa.

According to each of the above-described methods, the current confinement layer can be formed so that its conductive layer has a shape narrowing toward the clad layer, that is, widening along the direction toward the active layer. Thus, the surface-emitting laser with a low threshold value and low power consumption can be provided by a simple manufacturing process.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

According to the present invention, by the structural features of the current confinement layer of a surface-emitting laser, electric current can be applied evenly to the active layer, and at the same time, the electric resistance of the surface-emitting laser can be reduced so that a surface-emitting laser of a low threshold and low power consumption can be realized.

First, a description will be given of a 1.3 μm surface-emitting laser 100 including an InGaAs substrate according to a first embodiment of the present invention.

Figure 8A:
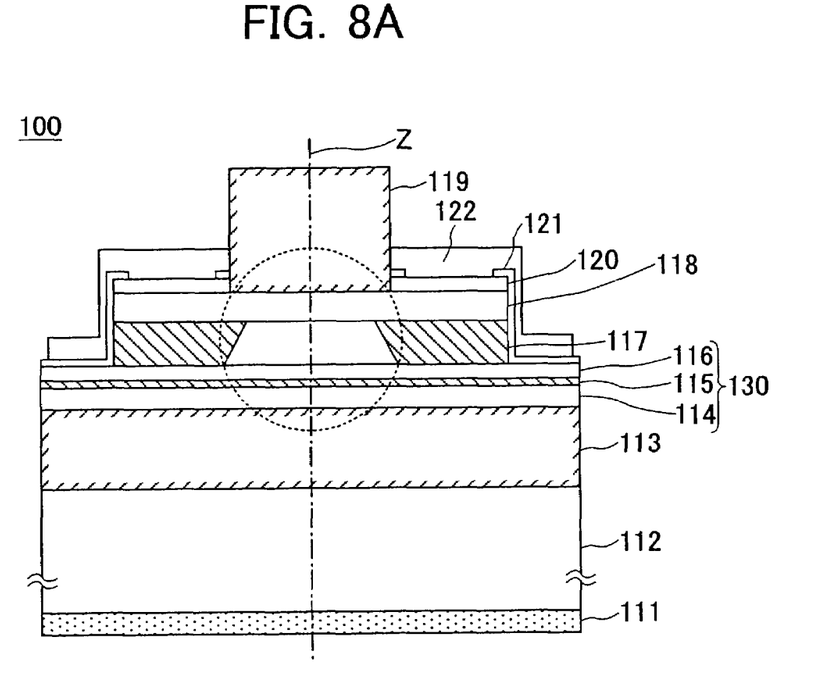
FIG. 8A is a sectional view of a surface-emitting laser according to a first embodiment of the present invention.
Figure 8B:
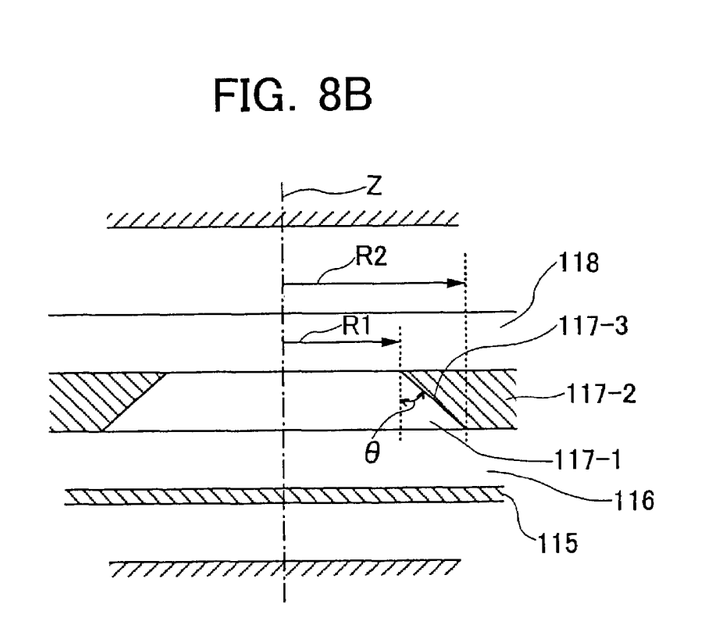
FIG. 8B is an enlarged view of the circled part of the surface-emitting laser of FIG. 8A.

FIGS. 8A and 8B are diagrams showing the configuration of the surface-emitting laser 100. FIG. 8A is a sectional view of the surface-emitting laser 100 according to the first embodiment, and FIG. 8B is an enlarged view of the circled part of the surface-emitting laser 100 of FIG. 8A.

According to FIG. 8A, the surface-emitting laser 100 includes a substrate 112, a lower negative electrode 111 provided to the bottom surface of the substrate 112, a multilayer film reflecting mirror 113 formed on the substrate 112, a resonator 130 formed on the reflecting mirror 113, a current confinement layer 117 formed on the resonator 130, a clad layer 118 provided on the current confinement layer 117, a multilayer film reflecting mirror 119 formed on the clad layer 118, a contact layer 120 formed on part of the clad layer 118, a passivation layer 121 formed on the contact layer 120, and an upper positive electrode 122 formed on the passivation layer 121 so as to contact part of the contact layer 120. The resonator 130 is formed of lower and upper clad layers 114 and 116 and an active layer 115 sandwiched therebetween. The current confinement layer 117 is composed of a conductive part 117-1 formed around the central axis of the surface-emitting laser 100 and an insulating part 117-2 formed around the conductive part 117-1. The layer structure on the upper clad layer 116 forms a cylindrical mesa, whose central axis coincides substantially with the central axis Z of the surface-emitting laser 100. Put more exactly, the central axis Z of the surface-emitting laser is an optical axis determined optically.

The lower electrode 111, which is formed of, for instance, a Au film of 150 nm in thickness and a AuGe film of 30 nm in thickness, includes an ohmic electrode. The AuGe film is formed on the side opposing the substrate 112 so as to increase contact resistance with and adhesion to the substrate 112.

The substrate 112 is formed of, for instance, n-type $In_{0.27}Ga_{0.73}As$ of a doping density of $2\times10^{18}$ cm$^{-3}$.

The multilayer film reflecting mirror 113 is formed of, for instance, an n-type semiconductor multi-layer film. The n-type semiconductor multilayer film reflecting mirror 113 is formed by layering, for instance, 30.5 pairs of n-type 103.97 nm-thick $Al_{0.261}In_{0.739}P$ and n-type 93 nm-thick $In_{0.27}Ga_{0.73}As$ films each corresponding to an optical ¼ wavelength so that the $Al_{0.261}In_{0.739}P$ and $In_{0.27}Ga_{0.73}As$ films alternate with each other. This layer structure starts and ends with the n-type $Al_{0.261}In_{0.739}P$ films (layers). Each of the films (layers) has a doping density of $2\times10^{18}$ cm$^{-3}$.

Each of the lower and upper clad layers 114 and 116 is formed of, for instance, undoped $In_{0.266}Al_{0.218}Ga_{0.516}As$ of 187.7 nm in thickness.

The active layer 115 is formed of, for instance, a strained quantum well active layer of undoped $In_{0.45}Ga_{0.55}As$ of 8 nm in thickness. The active layer 115, together with the lower and upper clad layers 114 and 116, forms the internal resonator 130.

The clad layer 118 provided on the current confinement layer 117 is formed of, for instance, p-type $In_{0.756}Ga_{0.254}P$ of a doping density of $1\times10^{18}$ cm$^{-3}$ and a thickness of 103.97 nm.

The contact layer 120 is formed of, for instance, p-type $In_{0.27}Ga_{0.73}As$ of a doping density of $1\times10^{19}$ cm$^{-3}$ and a thickness of 651 nm.

The multilayer film reflecting mirror 119 is formed of, for instance, a multilayer film of dielectric layers and semiconductor layers. For instance, the multilayer film reflecting mirror 119 is formed of 4.5 pairs of 101.6 nm-thick Si and 224.1 nm-thick $SiO_2$ films each corresponding to the optical ¼ wavelength so that the Si and $SiO_2$ films alternate with each other. However, the physical film thicknesses of the Si and $SiO_2$ films vary depending on their respective refractive indices, thus taking different values.

The passivation layer 121 is formed of, for instance, $SiO_2$ of 300 nm in thickness.

The upper positive electrode 122 is formed by layering a Ti film of 200 nm in thickness, a Pt film of 300 nm in thickness, and a Au film of 1,000 nm in thickness in the order described on a film formed by alloying a Au film of 15 nm in thickness with a AuZn film of 160 nm in thickness by heating.

The current confinement layer 117 is composed of the conductive part 117-1 and the insulating part 117-2 each of 122.94 nm in thickness. The conductive part 117-1 is formed of, for instance, a p-type semiconductor of a doping density of $1\times10^{18}$ cm$^{-3}$, while the insulating part 117-2 is formed of, for instance, oxidized conductive part 117-1 material.

In the conductive part 117-1, an upper part has a higher Al density. For instance, the composition of the conductive part 117-1 is $In_{0.258}Al_{0.605}Ga_{0.137}As$ where the conductive part 117-1 contacts the upper clad layer 116 provided immediately thereunder. The replacement of Ga by Al proceeds as the composition is measured at a higher point so that the composition becomes $In_{0.258}Al_{0.742}As$ where the conductive part 117-1 contacts the clad layer 118 provided immediately thereon. The insulating part 117-2 is formed by, for instance, oxidizing the material of the conductive part 117-1.

According to FIG. 8B, a sidewall surface 117-3, which is the interface between the conductive part 117-1 and the insulating part 117-2, is formed with an inclination angle $\theta$ to the directions perpendicular to the film surface (that is, the directions of the film thickness) so that the conductive part 117-1 has a tapered shape narrowing (decreasing in radius) toward the clad layer 118. It is preferable that the inclination angle $\theta$ of the sidewall surface 117-3 to the directions of the film thickness satisfies $\arctan(2.3) \leq \theta < 90°$. In this embodiment, the distance R1 between the central axis Z of the surface-emitting laser 100 and the part where the sidewall surface 117-3 contacts the clad layer 118 is set to 2.25 μm and the distance R2 between the central axis Z of the surface-emitting laser 100 and the part where the sidewall surface 117-3 contacts the upper clad layer 116 is set to 2.50 μm. That is, the inclination angle $\theta$ is set to $\arctan(0.25/0.1) = \arctan(2.5)$.

Figure 9:
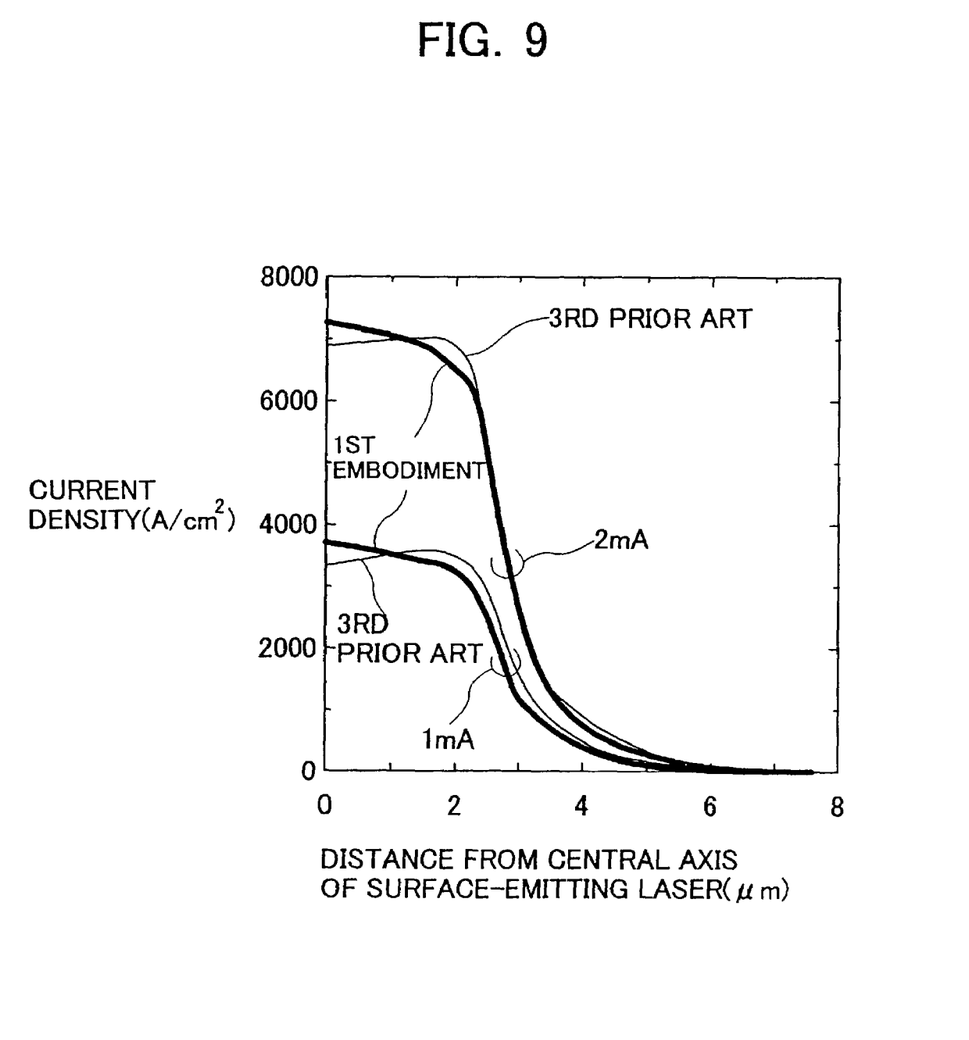
FIG. 9 is a graph showing current density distributions in the surface-emitting laser of the first embodiment of the present invention.
Figure 10:
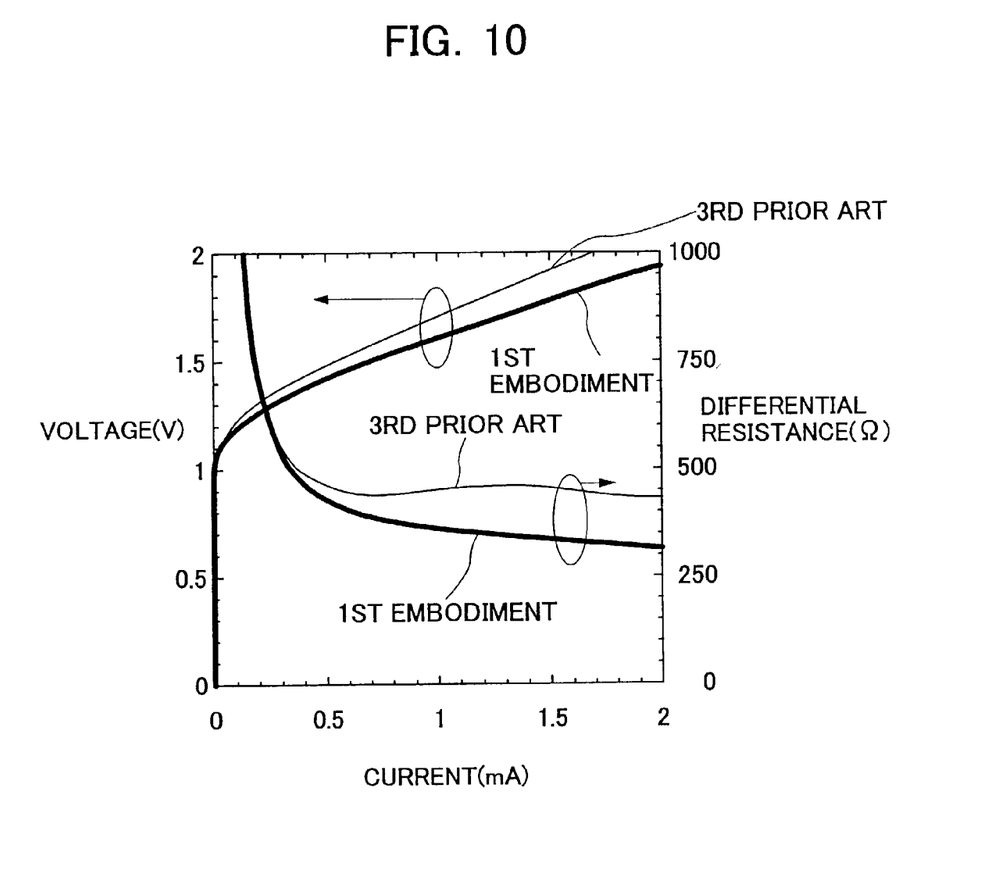
FIG. 10 is a graph showing the voltage-current characteristics and the differential resistance-current characteristics of the surface-emitting laser of the first embodiment of the present invention.

FIG. 9 is a graph showing the current density distributions of electric currents applied to the active layer 115. These distributions were obtained by a simulation conducted based on the configuration of this embodiment. FIG. 9 shows the results of the 1 mA and 2 mA applied currents together with the results of the simulation of the third prior art for comparison. FIG. 10 is a graph showing the current-voltage characteristics and the differential resistance-current characteristics of the surface-emitting laser 100 which characteristics were obtained by a simulation based on the configuration of this embodiment. FIG. 10 also shows the results of the simulation of the third prior art for comparison.

In FIG. 9, the horizontal axis represents the distance from the central axis Z of the surface-emitting laser 100 in the direction of the film surface and the vertical axis represents the current density in the active layer 115. According to FIG. 9, the current density is maximized at the central axis Z of the surface-emitting laser 100, and remains constant up to around the point of 2.50 μm, which is the distance R2 from the central axis Z to the sidewall surface 117-3 of the current confinement layer 117, to decrease sharply outside that point. Compared with the third prior art, the current density is increased at the central axis Z without peaking just below the sidewall surface 117-3 of the current confinement layer 117. Accordingly, the electric current can be concentrated at a small region on the active layer 115, the current density of the applied current becomes uniform, and the surface-emitting laser 100 can oscillate with a basic mode, that is, the surface-emitting laser 100 can oscillate with a lower threshold current. Thus, the oscillation efficiency of the surface-emitting laser 100 can be improved.

Further, according to FIG. 10, the differential resistance of the surface-emitting laser 100 is smaller than that of the third prior art when the current is larger than or equal to 0.3 mA. That is, the power consumption of the surface-emitting laser 100 can be controlled to a lower level.

Thus, according to the first embodiment of the present invention, the surface-emitting laser 100 with a low threshold value and low power consumption can be realized.

A description will be given below, with reference to FIGS. 11A through 11F, of a process of manufacturing the surface-emitting laser 100 according to this embodiment.

Figure 11A:
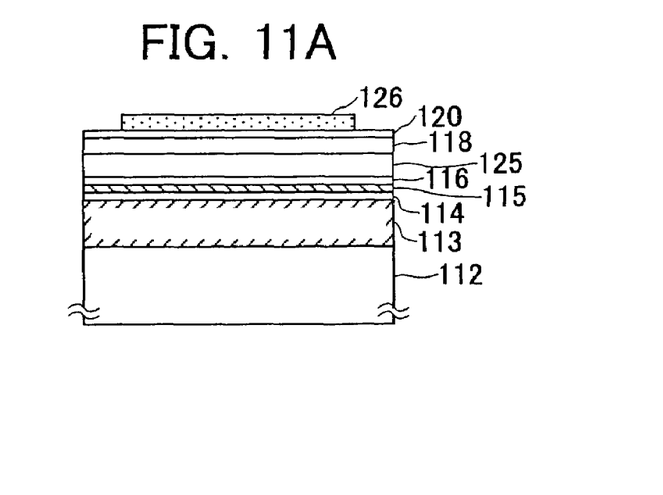
FIGS. 11A through 11F are diagrams showing a process of manufacturing the surface-emitting laser according to the first embodiment of the present invention.

First, as shown in FIG. 11A, the multilayer film reflecting mirror 113 is formed on the n-type $In_{0.27}Ga_{0.73}As$ substrate of a doping density of $2 \times 10^{18}$ cm$^{-3}$ by layering 30.5 pairs of n-type 103.97 nm-thick $Al_{0.261}In_{0.739}P$ and n-type 93 nm-thick $In_{0.27}Ga_{0.73}As$ films so that the $Al_{0.261}In_{0.739}P$ and $In_{0.27}Ga_{0.73}As$ films alternate with each other by metalorganic chemical vapor deposition (MOCVD). This deposition starts and ends with the n-type $Al_{0.261}In_{0.739}P$ films. Then, the undoped $In_{0.266}Al_{0.218}Ga_{0.516}As$ lower clad layer 114 of 187.7 nm in thickness, the undoped $In_{0.45}Ga_{0.55}As$ active layer 115 of 8 nm in thickness, and the undoped $In_{0.266}Al_{0.218}Ga_{0.516}As$ upper clad layer 116 of 187.7 nm in thickness are formed on the multilayer film reflecting mirror 113 by MOCVD.

Further, a p-type InAlGaAs semiconductor layer 125 of a doping density of $1 \times 10^{18}$ cm$^{-3}$ and a thickness of 122.94 nm is formed on the upper clad layer 116 by MOCVD. The semiconductor layer 125 is to be formed into the current confinement layer 117. At the start of the deposition, source gases are supplied so that $In_{0.258}Al_{0.605}Ga_{0.137}As$ is deposited. Thereafter, the flow rates of the source gases are controlled so that $In_{0.258}Al_{0.742}As$ is deposited at the end of the deposition.

The p-type $In_{0.756}Ga_{0.254}P$ clad layer 118 of a thickness of 103.97 nm and a doping density of $1 \times 10^{18}$ cm$^{-3}$ is formed on the semiconductor layer 125, and the p-type $In_{0.27}Ga_{0.73}As$ contact layer 120 of a thickness of 651 nm and a doping density of $1 \times 10^{19}$ cm$^{-3}$ is formed on the clad layer 118.

Further, a $SiO_2$ mask 126 of 15 μm in diameter and 300 nm in thickness is formed on the contact layer 120 by photolithography or electron beam lithography.

Figure 11B:
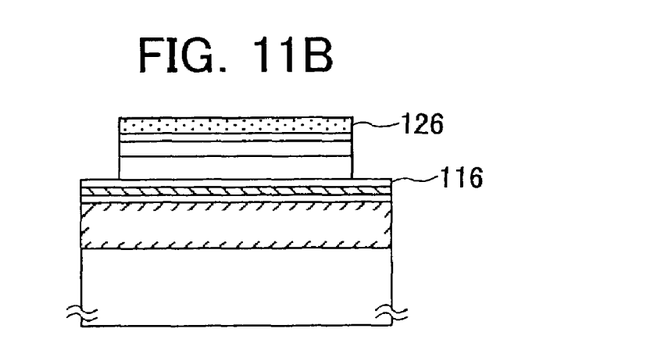

Next, as shown in FIG. 11B, etching is performed on the structure of FIG. 11A by reactive ion etching (RIE) using chlorine gas so that the upper surface of the upper clad layer 116 is partly exposed. Thereby, a cylindrical mesa is formed. The central axis of the cylindrical mesa is the central axis of the surface-emitting laser 100.

Figure 11C:
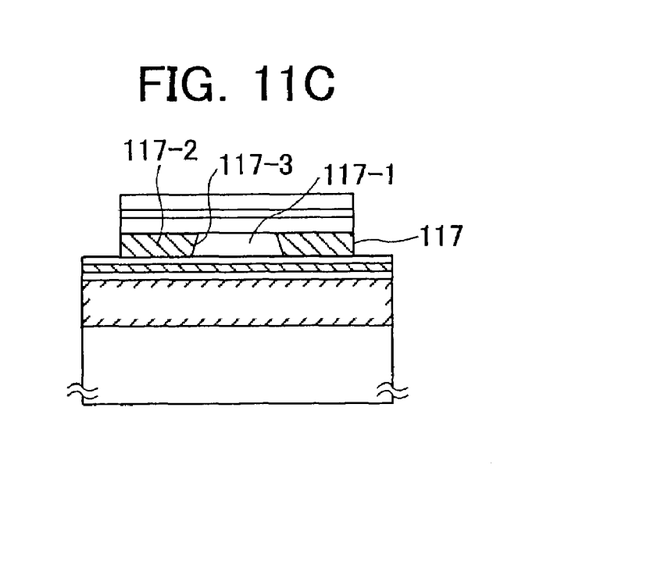

As shown in FIG. 11C, the part of the upper surface of the upper clad layer 116 exposed by the etching is masked with $SiO_2$ so that thermal oxidation is performed on the p-type InAlGaAs semiconductor layer 125 shown in FIG. 11B from the side surface of the cylindrical mesa. The thermal oxidation is performed at an oxidation temperature of 460° C. for five hours in a wet (steam) atmosphere using nitrogen as a carrier gas with a flow rate of 1 l/min. The semiconductor layer 125 has a higher Al density in its upper part than its lower part as previously described. Therefore, the selectively oxidized part of the semiconductor layer 125, that is, the insulating part 117-2, is formed to have its upper part extending deeper (radially) into the center from the periphery than its lower part in proportion to the increasing Al density. Thereby, the conductive part 117-1 is formed to become narrower (decrease in radius) in the upward direction toward the clad layer 118 from the active layer 115. Accordingly, the sidewall surface 117-3, which is the interface between the insulating part 117-2 and the conductive part 117-1 remaining without being oxidized, widens (increases in radius) with the inclination angle $\theta$ to the directions perpendicular to the film surface along the direction toward the active layer 115 (that is, when viewed in the direction toward the active layer 115).

Figure 11D:
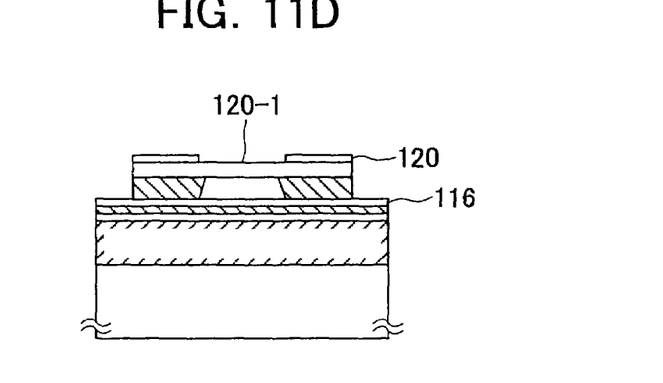

Next, as shown in FIG. 1D, the mask 126 and the $SiO_2$ mask formed on the upper surface of the clad layer 116 are removed by RIE using $CF_4$. Then, a circular part 120-1 of the contact layer 120 which circular part is 5 µm in diameter around its center aligned with the center of the cylindrical mesa is selectively etched by photolithography and a sulfuric acid-hydrogen peroxide-based etchant.

Figure 11E:
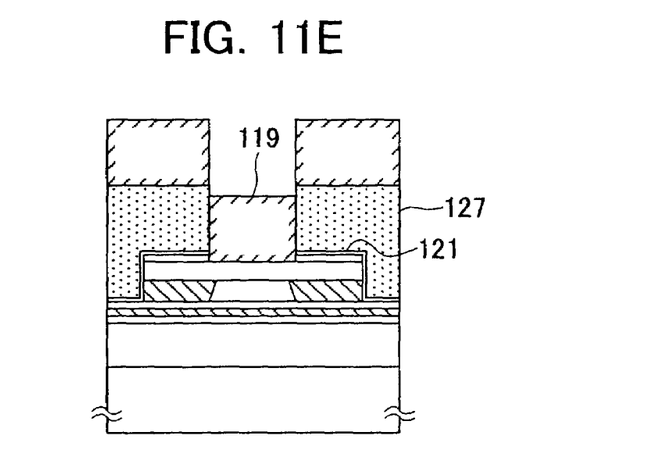

As shown in FIG. 11E, the $SiO_2$ passivation film 121 of 300 nm in thickness is formed over the entire structure of FIG. 11D, and patterning by photolithography and etching using a buffer hydrofluoric acid solution are performed so as to etch the part of the passivation film 121 formed in the circularly etched part 120-1 of the contact layer 120. Next, a resist 127 of 1.5 µm in thickness is formed, and patterning is performed by photolithography so that the part of the resist 127 which part is formed in the circularly etched part 120-1 of the contact layer 120 is etched. Then, the multilayer film reflecting mirror 119 is formed by layering, by electron beam evaporation, 4.5 pairs of 101.6 nm-thick Si and 224.1 nm-thick $SiO_2$ films each corresponding to the optical ¼ wavelength so that the Si and $SiO_2$ films alternate with each other. The deposition starts and ends with the Si films.

Figure 11F:
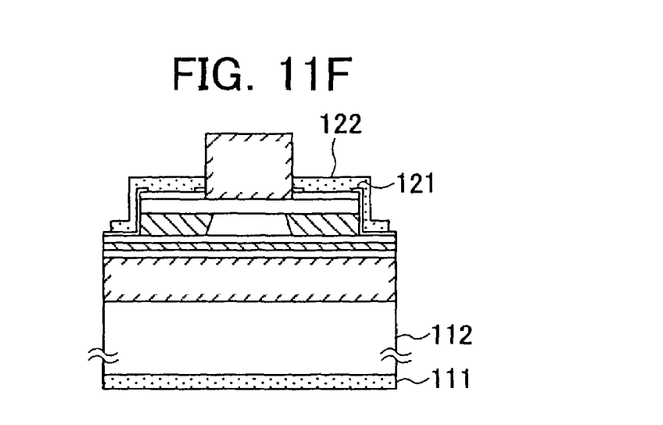

As shown in FIG. 11F, patterning by photolithography and etching using a buffer hydrofluoric acid solution are performed so as to remove the deposits on the passivation film 121 around the multilayer film reflecting mirror 119. Next, part of the passivation film 121 is patterned and etched so that part of the contact layer 120 is exposed.

Then, the passivation film 121 is masked so that a Au film of 15 nm in thickness and a AuZn film of 160 nm in thickness are vapor-deposited, subjected to heating at 430° C. for five minutes, and alloyed on the exposed part of the contact layer 120. Further, the mask is lifted off the passivation film 121, and a Ti film of 200 nm in thickness, a Pt film of 300 nm in thickness, and a Au film of 1,000 nm in thickness are layered on the alloy and the passivation film 121 in the order described, so that the upper electrode 122 is formed.

Next, the bottom surface of the substrate 112 is polished so that the substrate 112 becomes 100 µm in thickness. Then, a AuGe film of 30 nm in thickness and a Au film of 150 nm in thickness are layered on the bottom surface of the substrate 112 in the order described, so that the lower electrode 111 is formed.

Thus, the surface-emitting laser 100 as shown in FIG. 8A is formed.

In the first embodiment, the current confinement layer 117 has a single layer structure in which the Al composition varies so that the sidewall surface 117-3 between the conductive part 117-1 and the insulating part 117-2 has a predetermined inclination to the direction perpendicular to the film surface. However, the current confinement layer 117 may have a layer structure of a plurality of semiconductor films of different Al compositions.

Next, a description will be given of a surface-emitting laser 200 including a plurality of current confinement layers of semiconductor films of different Al compositions according to a second embodiment of the present invention.

Figure 12A:
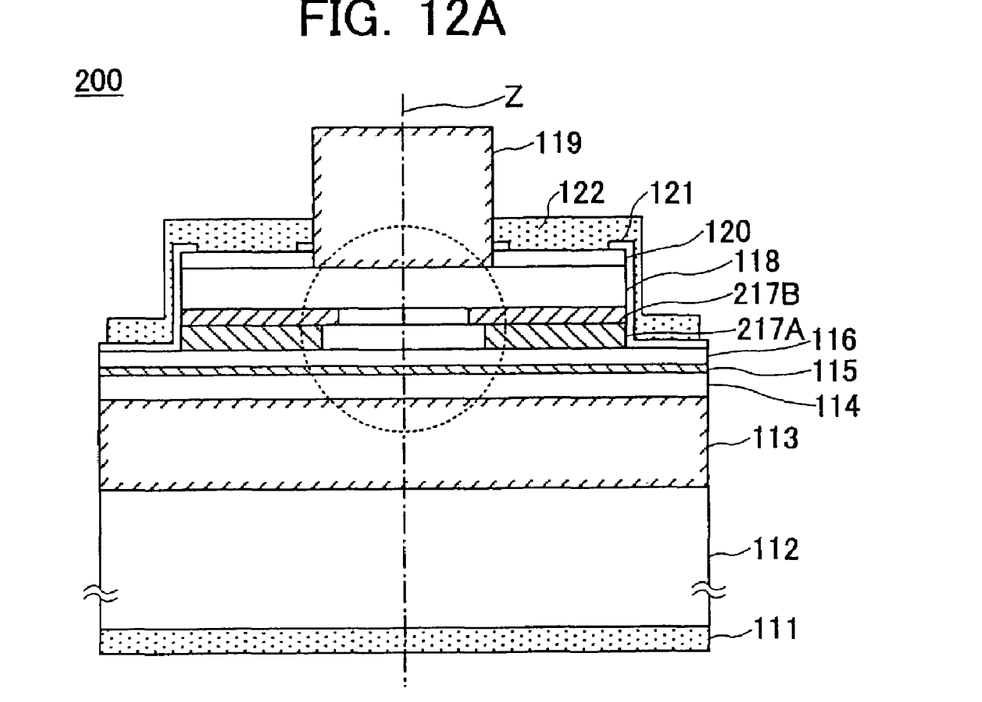
FIG. 12A is a sectional view of a surface-emitting laser according to a second embodiment of the present invention.
Figure 12B:
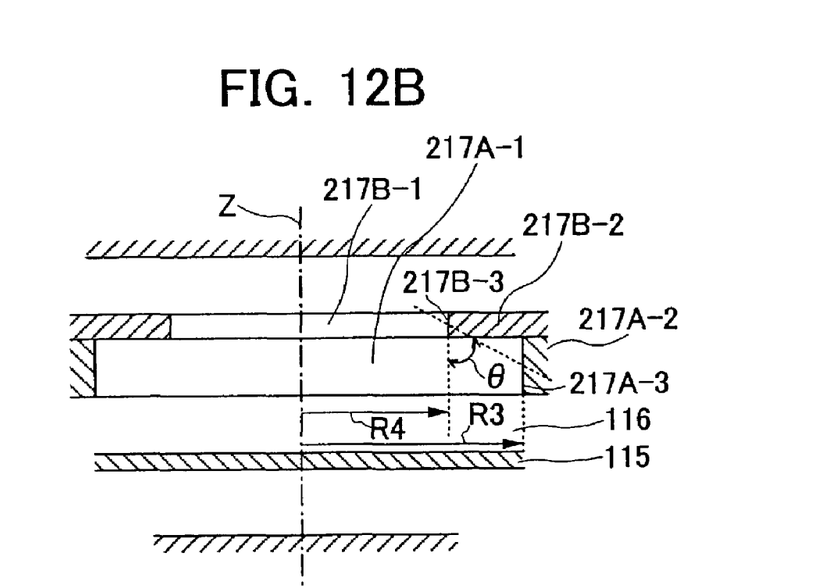
FIG. 12B is an enlarged view of the circled part of the surface-emitting laser of FIG. 12A.

FIGS. 12A and 12B are diagrams showing the configuration of the surface-emitting laser 200. FIG. 12A is a sectional view of the surface-emitting laser 200, and FIG. 12B is an enlarged view of the circled part of the surface-emitting laser 200 of FIG. 12A. In FIGS. 12A and 12B, the same elements as those previously described are referred to by the same numerals, and a description thereof will be omitted.

According to FIG. 12A, the surface-emitting laser 200 includes the lower negative electrode 111, the n-type substrate 112, the multilayer film reflecting mirror 113, the resonator 130 formed of the lower and upper clad layers 114 and 116 and the active layer 115 sandwiched therebetween, two stacked current confinement layers 217A and 217B formed on the resonator 130, the clad layer 118, the multilayer film reflecting mirror 119, the contact layer 120, the passivation layer 121, and the upper positive electrode 122.

The current confinement layers 217A and 217B are a plurality of stacked current confinement layers formed on the upper clad layer 116 in the order described.

The current confinement layer 217A is formed of a conductive part 217A-1 of 102.94 nm in thickness and an insulating part 217A-2. The conductive part 217A-1 is formed of, for instance, p-type $In_{0.258}Al_{0.605}Ga_{0.137}As$ of a doping density of $1\times10^{18}$ cm$^{-3}$. The current confinement layer 217B is formed of a conductive part 217B-1 of 20 nm in thickness and an insulating part 217B-2. The conductive part 217B-1 is formed of, for instance, p-type $In_{0.256}Al_{0.744}As$ of a doping density of $1\times10^{18}$ cm$^{-3}$. Further, the insulating parts 217A-2 and 217B-2 are formed of oxides formed by selectively oxidizing the materials of the conductive parts 217A-1 and 217B-1, respectively.

As shown in FIG. 12B, the distance R3 between the central axis Z of the surface-emitting laser 200 and a sidewall surface 217A-3 that is the interface between the conductive part 217A-1 and the insulating part 217A-2 is larger than the distance R4 between the central axis Z of the surface-emitting laser 200 and a sidewall surface 217B-3 that is the interface between the conductive part 217B-1 and the insulating part 217B-2. That is, the conductive part 217A-1 closer to the active layer 115 than is the conductive part 217B-1 is formed to be larger than the conductive part 217B-1. Accordingly, the conductive parts 217A-1 and 217B-1 have, as a whole, a shape narrowing (decreasing in radius) toward the clad layer 118, or widening (increasing in radius) along the direction toward the active layer 115.

According to FIG. 12B, the inclination angle θ that the sidewall surface of the current confinement structure formed by the current confinement layers 217A and 217B has with respect to the directions perpendicular to the film surface is defined as follows. That is, the inclination that the line connecting the centers of the vertical sidewall surfaces 217A-3 and 217B-3 of the current confinement layers 217A and 217B has with respect to the directions perpendicular to the film surface is defined as the inclination angle θ.

When the current density distributions and the differential resistance-current characteristics of electric currents applied to the active layer 115 were obtained by a simulation based on the configuration of the second embodiment, the same results as those of the first embodiment were obtained.

In the second embodiment, the two current confinement layers 217A and 217B are employed. However, the number of current confinement layers is not limited to two, and more than two current confinement layers may be employed. Further, the multilayer film reflecting mirror 119, which is formed of dielectric layers and semiconductor layers in the above-described embodiment, may be a semiconductor multilayer film or a dielectric multilayer film.

A description will be given below of a process of manufacturing the surface-emitting laser 200 according to the second embodiment of the present invention. In the following description, the same steps as those of the process of the first embodiment will be omitted.

The manufacturing processes of the first and second embodiments are different in the step of forming the current confinement structure.

A p-type $In_{0.258}Al_{0.605}Ga_{0.137}As$ semiconductor layer of a thickness of 102.94 nm and a doping density of $1\times10^{18}$ cm$^{-3}$, which semiconductor layer is to be formed into the current confinement layer 217A, is formed on the upper clad layer 116 by MOCVD. Then, a p-type In$_{0.256}$Al$_{0.744}$As semiconductor layer of a thickness of 20 nm and a doping density of 1×10$^{18}$ cm$^{-3}$, which semiconductor layer is to be formed into the current confinement layer 217B, is formed on the previously formed p-type In$_{0.258}$Al$_{0.605}$Ga$_{0.137}$As semiconductor layer.

Thereafter, the same steps as those of the manufacturing process of the first embodiment are performed so that the surface-emitting laser 200 of the second embodiment is manufactured.

Thus, according to the present invention, the current confinement structure on the active layer is formed so that the sidewall surface of its conductive part widens (increases in radius) as it approaches the active layer. Therefore, electric current can be applied evenly to the active region of the active layer, and at the same time, electric resistance can be lowered. As a result, a surface-emitting laser with a low threshold value and low power consumption can be realized.

Further, according to the present invention, the current confinement structure having the above-described shape can be formed by forming a semiconductor film by increasing its Al density continuously or film by film and subjecting the semiconductor film to thermal oxidation. Therefore, the surface-emitting laser with a low threshold value and low power consumption can be realized in a simple manufacturing process.

The present invention is not limited to the specifically disclosed embodiments, but variations and modifications may be made without departing from the scope of the present invention. For instance, the present invention is also applicable to a surface-emitting laser of a different wavelength from that employed in the above-described embodiments.

What is claimed is:

1. A surface-emitting laser comprising:
   a substrate having first and second opposing sides;
   a first multilayer film reflecting mirror formed on the first side of said substrate;
   an active layer formed on said first multilayer film reflecting mirror;
   a current confinement layer formed on said active layer;
   a clad layer formed on said current confinement layer;
   a second multilayer film reflecting mirror formed on part of said clad layer;
   a first electrode formed on said clad layer at a side of said second multilayer film reflecting mirror for injecting current into said active layer only from the side of said second multilayer film reflecting mirror; and
   a second electrode formed on the second side of said substrate,
   wherein said current confinement layer comprises a conductive part and an insulating part surrounding the conductive part, the conductive part being defined by a sidewall surface that widens along a direction toward said active layer,
   wherein electric current applied to said active layer has current density thereof maximized at a central axis of the surface-emitting laser in said active layer, and
   wherein an inclination angle θ that the sidewall surface of the conductive part has with respect to directions perpendicular to a surface of said current confinement layer satisfies arctan (2.3) ≦θ<90°.

2. The surface-emitting laser as claimed in claim 1, wherein the sidewall surface widens in a tapered manner.

3. The surface-emitting laser as claimed in claim 1, wherein said current confinement layer comprises a plurality of layers so that the sidewall surface defining the conductive part is stepped.

4. The surface-emitting laser as claimed in claim 1, wherein:
   the conductive part and the insulating part of said current confinement layer comprise a semiconductor including Al and an insulator including Al, respectively; and
   the conductive part has a higher Al density in a first part thereof than in a second part thereof, the first part being closer to said clad layer than is the second part.

5. A surface-emitting laser comprising:
   a substrate having first and second opposing sides;
   a first multilayer film reflecting mirror formed on the first side of said substrate;
   an active layer formed on said first multilayer film reflecting mirror;
   a current confinement layer formed on said active layer;
   a clad layer formed on said current confinement layer;
   a second multilayer film reflecting mirror formed on part of said clad layer;
   a first electrode formed on said clad layer at a side of said second multilayer film reflecting mirror for injecting current into said active layer only from the side of said second multilayer film reflecting mirror; and
   a second electrode formed on the second side of said substrate,
   wherein said current confinement layer comprises a conductive part and an insulating part surrounding the conductive part, the conductive part having a shape narrowing toward said clad layer from said active layer,
   wherein electric current applied to said active layer has current density thereof maximized at a central axis of the surface-emitting laser in said active layer, and
   wherein an inclination angle θ that the sidewall surface of the conductive part has with respect to directions perpendicular to a surface of said current confinement layer satisfies arctan (2.3)≦θ<90°.

6. The surface-emitting laser as claimed in claim 5, wherein the shape of the conductive part of said current confinement layer is tapered toward said clad layer.

7. The surface-emitting laser as claimed in claim 5, wherein said current confinement layer comprises a plurality of layers having respective conductive parts that form the conductive part of said current confinement layer so that the shape of the conductive part of said current confinement layer is stepped.

8. The surface-emitting laser as claimed in claim 5, wherein the insulating part of said current confinement layer has a first part and a second part, the first part being closer to said clad layer than is the second part, the first part extending radially further inward to a center of said current confinement layer than the second part.

* * * * *